(12) United States Patent
Choate et al.

(10) Patent No.: US 7,890,831 B2
(45) Date of Patent: Feb. 15, 2011

(54) PROCESSOR TEST SYSTEM UTILIZING FUNCTIONAL REDUNDANCY

(75) Inventors: Michael L. Choate, Round Rock, TX (US); Mark D. Nicol, Austin, TX (US); Heather L. Hanson, Austin, TX (US); Michael J. Borsch, Austin, TX (US); Arthur M. Ryan, Round Rock, TX (US); Chandrakant Pandya, Pflugerville, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 434 days.

(21) Appl. No.: 12/136,458

(22) Filed: Jun. 10, 2008

(65) Prior Publication Data

US 2009/0307549 A1 Dec. 10, 2009

(51) Int. Cl.
*G06F 11/00* (2006.01)
*G01R 31/28* (2006.01)

(52) U.S. Cl. .......................... 714/742; 714/10; 714/47; 714/736

(58) Field of Classification Search ............. 714/10–13, 714/45, 47, 724, 729, 734, 736, 742
See application file for complete search history.

(56) References Cited

U.S. PATENT DOCUMENTS

| 5,226,152 | A | * | 7/1993 | Klug et al. ................. 714/12 |
| 7,093,158 | B2 | | 8/2006 | Barron et al. |
| 7,159,137 | B2 | | 1/2007 | Nemawarkar et al. |
| 7,404,105 | B2 | | 7/2008 | Arai |
| 7,475,309 | B2 | * | 1/2009 | Picano et al. ............... 714/727 |
| 7,673,188 | B2 | * | 3/2010 | Choate et al. ............... 714/45 |
| 7,698,612 | B2 | * | 4/2010 | Whetsel ..................... 714/727 |
| 2002/0093358 | A1 | * | 7/2002 | Kang .......................... 324/765 |
| 2009/0044057 | A1 | * | 2/2009 | Choate et al. ............... 714/40 |

OTHER PUBLICATIONS

Chen, P.P.; Mourad, A.N.; Fuchs, W.K.; , "Probability of correctness of processor-array outputs using periodic concurrent error detection," Reliability, IEEE Transactions on , vol. 45, No. 2, pp. 285-296, Jun. 1996 doi: 10.1109/24.510816.*

* cited by examiner

*Primary Examiner*—Cynthia Britt
(74) *Attorney, Agent, or Firm*—Meyertons, Hood, Kivlin, Kowert & Goetzel, P.C.; Erik A. Heter

(57) ABSTRACT

A system and method for testing a processor. The system includes a gold processor and a test processor, wherein the test processor is the device under test (DUT). The test processor and the gold processor are identical. A first memory is coupled to the gold processor by a first memory bus and a second memory, independent of the first, is coupled to the test processor by a second memory bus. The first and second memories are identical. A memory bus comparator coupled to the first and second memory buses compares memory bus signals generated by the gold and test processors, and selectively provide a first indication if a mismatch occurs. A peripheral bus comparator is also coupled to the gold and test processors, and compares downstream transactions generated by the gold and test processors and to provide a second indication if a peripheral bus comparison results in a mismatch.

20 Claims, 5 Drawing Sheets

PROCESSOR TEST SYSTEM UTILIZING FUNCTIONAL REDUNDANCY

BACKGROUND OF THE INVENTION

1. Field of the Invention

This invention relates to computer systems, and more particularly to functionally redundant computer systems as well as their use in a testing environment.

2. Description of the Related Art

Functionally redundant computer systems are well known in the art, and have a wide variety of applications. Functional redundancy may be implemented in computer systems requiring a high degree of reliability, such as in fault tolerant computer systems. A fault tolerant computer system utilizing functional redundancy typically includes two or more processors. The processors operate in synchronous functional lockstep with each other, i.e. each processor concurrently receives the same inputs, and is expected to concurrently provide the same outputs. Comparators (sometimes referred to as voting circuits) compare outputs from the processors. The comparator can detect a mismatch between the outputs of the two or more processors, and, depending on the configuration of the system, determine which of the processors has provided the correct output.

Functionally redundant computer systems such as those described above may also be useful in a test environment. For example, a system for testing a processor may be designed where a processor is tested by comparing its responses with those of a known good processor. A detected mismatch between processor outputs may indicate a fault in the processor that is undergoing test. The test system may also be configured to capture the state data at the time of the failure, which, at times may be useful in determining its cause. Test systems utilizing functional redundancy may be useful in both development and manufacturing environments.

SUMMARY OF THE INVENTION

A system and method for testing a processor is disclosed. In one embodiment, a system for testing a processor includes a gold processor and a test processor, wherein the test processor is the device under test (DUT). The test processor and the gold processor are identical processors. A first memory is coupled to the gold processor by a first memory bus and a second memory is coupled to the test processor by a second memory bus. The first and second memories are independent of one another. A memory bus comparator coupled to the first and second memory buses is configured to compare memory bus signals generated by the gold processor to memory bus signals generated by the test processor, and provide a first indication if a comparison results in a mismatch. A peripheral bus comparator is also coupled to the gold and test processors, and configured to compare downstream transactions generated by the gold processor to downstream transactions generated by the test processor and to provide a second indication if a peripheral bus comparison results in a mismatch.

A method for operating a test system is also disclosed. In one embodiment, the method includes operating a gold processor, wherein operating the gold processor includes generating and conveying memory signals to a first memory coupled to the gold processor via a first memory bus and generating and conveying downstream transactions to a peripheral bus comparator. The method further includes operating a test processor, wherein operating the test processor includes generating and conveying memory signals to a second memory coupled to the test processor via a second memory bus, and generating and conveying downstream transactions to a peripheral bus comparator. The method compares memory signals conveyed from the gold processor on the first memory bus to memory signals conveyed from the test processor on the second memory bus, wherein the first and second memories are independent of one another, and provides a first indication if said comparing memory signals results in a mismatch. The method also compares downstream transactions conveyed from the gold processor on the first peripheral bus to downstream transactions conveyed from the test processor on the second peripheral bus and provides a second indication if said comparing downstream transactions results in a mismatch In various embodiments, the test system includes a host computer, a comparator board coupled to the host computer, and a system board coupled to the comparator board. The comparator board includes processor sockets for mounting each of the gold and test processors, as well as the memory bus and peripheral bus comparators. The host computer is coupled to the comparator board, and is configured to direct the testing of the test processor. The host computer is coupled to receive an indication of a comparator mismatch when detected by one of the peripheral and memory bus comparators. The system board is a computer system motherboard that is coupled to the comparator board by a processor socket. When the test system is operating, the comparator board, in effect, acts as the processor for the system board, while the system board only 'sees' a single processor in operation.

BRIEF DESCRIPTION OF THE DRAWINGS

Other aspects of the invention will become apparent upon reading the following detailed description and upon reference to the accompanying drawings in which.

Figure 1:
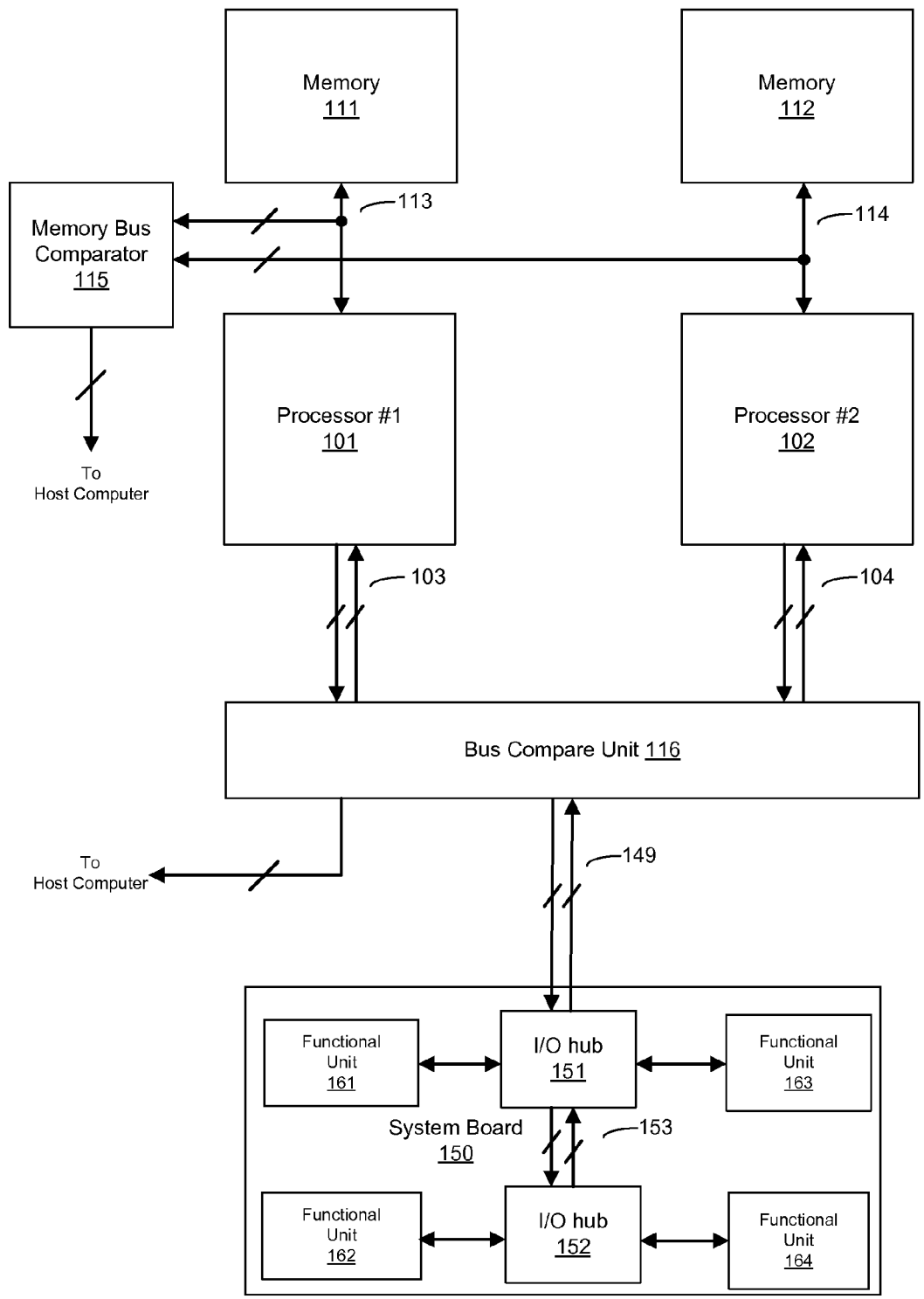
FIG. 1 is a block diagram of one embodiment of a processor test system.

While the invention is susceptible to various modifications and alternative forms, specific embodiments thereof are shown by way of example in the drawings and will herein be described in detail. It should be understood, however, that the drawings and description hereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Turning now to FIG. 1, a block diagram of one embodiment of a processor test system is shown. In the embodiment shown, test system 10 includes a first processor 101 and a second processor 102. In this particular example, processor 101 is the device under test (DUT), i.e. the test processor, while processor 102 is the gold processor. As the gold processor, processor 102 is known good and provides a basis of comparison for operations conducted by the test processor, processor 101. During operation of test system 10, processors 101 and 102 are intended to be operated in synchronous functional lockstep, which means the processor cycles of both processors coincide and are intended to be identical. Test system 10 monitors processors 101 and 102 for any divergence in their respective operations, and if such a divergence is detected, may perform additional actions as a result.

Processor 101 is coupled to memory 111, while processor 102 is coupled to memory 112. In the embodiment shown, memories 111 and 112 are identical random access memories (RAMs), both being of the same size and type (e.g., double data rate, or DDR), as well as in other specifications. However, both memories 111 and 112 are independent of one another. Memory 111 is coupled to processor 101 by memory bus 113, while memory 112 is coupled to processor 102 by memory bus 114. A memory bus comparator 115 is coupled to both memory buses 113 and 114, and is configured to receive and compare memory signals generated by processors 101 and 102, respectively. Should memory bus comparator 115 detect a mismatch between memory signals generated by processor 101 and processor 102, an indication is generated responsive thereto. This indication may be provided to a host computer and/or to logic of the test system in order to trigger one or more of several configurable actions related to obtaining state information, which will be discussed in further detail below.

Each of processors 101 and 102 may include an integrated north bridge unit, through which they are coupled to a bus compare unit 116. The integrated north bridge unit includes a memory controller that is configured to control accesses (both reads and writes) to the respective memories coupled to processors 101 and 102.

Processors 101 and 102 are coupled to bus compare unit 116 via peripheral bus links 103 and 104, respectively. Bus links 103 and 104 (as well as bus 149) are, in this embodiment, links of a point-to-point (PTP) packet bus, such as one that conforms to the HyperTransport™ specification. However, embodiments utilizing other bus types are also possible and contemplated. Bus compare unit 116 is configured to compare downstream traffic generated by processor 101 to that of processor 102 (for the purposes of this disclosure, 'downstream' traffic can be considered traffic that is moving away from the processors, while 'upstream' traffic is that which is moving toward the processors). If a mismatch is detected in comparing downstream traffic from processor 101 to that of processor 102, bus compare unit 116 generates an indication which is then provided to the host computer.

Bus compare unit 116 is further coupled to convey downstream traffic to I/O hub 151 of system board 150, and to receive upstream traffic therefrom, via bus link 149. In one embodiment, the downstream traffic conveyed by bus compare unit 116 is received from the test processor, or processor 101 in this case. System board 150 is a computer system motherboard that operates, with processor 101, as a computer system. Processor 101 conveys traffic downstream to I/O hub 151, which may then be further conveyed to I/O hub 152 (via bus link 153) and/or the various functional units 161-164. The functional units 161-164 may include various peripheral devices, such as hard disk drives, CD or DVD-ROM drives, a keyboard, a mouse, host controllers (e.g., a Universal Serial Bus host controller), and so forth. These functional units may generate traffic that is transmitted upstream through the various bus links to a target processor. In this case, the upstream traffic is conveyed to both processor 101 and processor 102, which may generate further responses that provide a basis for comparison.

In various embodiments, memory bus comparator 115 and bus compare unit 116 are implemented using field programmable gate arrays (FPGA's). However, other embodiments are possible and contemplated wherein memory bus comparator 115 and bus compare unit 116 are implemented using any other suitable means, such as implementation via an application specific integrated circuit (ASIC).

Figure 2:
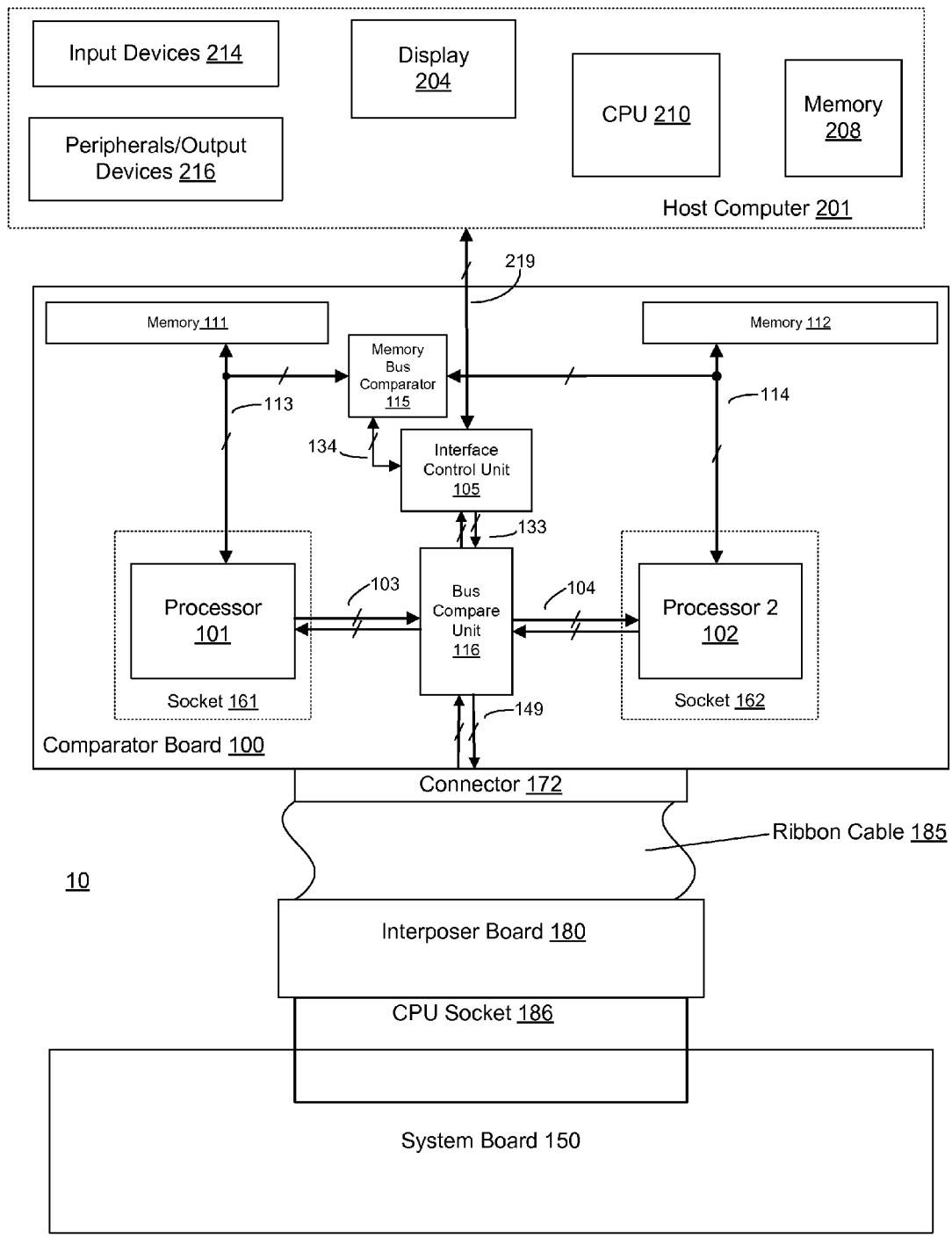
FIG. 2 is another block diagram of an embodiment of a test system showing the arrangement of the comparator boards, the system board, and the host computer.

FIG. 2 is another block diagram of an embodiment of a test system showing the arrangement of the comparator boards, the system board, and the host computer. More particularly, FIG. 2 illustrates test system 10 in the context of host computer 201, which may monitor and control test operations. As noted above, test system 10 includes processors 101 and 102, memories 111 and 112, memory bus comparator 115, and bus compare unit 116. Each of these functional units is coupled to a comparator board 100, which also has interface control unit 105 coupled thereto. Interface control unit 105 provides a means of coupling comparator board 100 to host computer 201, via bus link 219 (which may be a different type of bus than bus links 103, 104, and 149). The indications of a mismatch that may be generated by memory bus comparator 115 and bus compare unit 116 may be conveyed to host computer 201 via interface control unit 105.

Comparator board 100 includes processor sockets 161 and 162, which are configured for receiving processors 101 and 102, respectively. Processor sockets 161 and 162 enable a user of the test system to change both the processor to be tested as well as the gold processor that is to be used to provide a basis for comparison. Accordingly, different models and/or revisions of processors that are suitable for use with sockets 161 and 162 may be usable by test system 10.

In order to further aid the ability to maintain synchronous operation between the test and gold processor, signal trace routing on comparator board 100 may be performed within tight tolerances. For example, signal traces may be routed such that signals conveyed to bus compare unit 116 from processor 101 are received at substantially the same time as signals conveyed from processor 102 to bus compare unit 116. Similarly, signal traces may also be routed such that signals conveyed from bus compare unit are received by both processors 101 and 102 in a manner that is substantially simultaneous. This type of signal trace routing may be performed for other functions as well (e.g., between the processors and memory bus comparator 115 and between the processors and their respective memories. The tolerances for signal trace variances may be as small as necessary to ensure synchronous operation of the processors. In one embodiment, the tolerance is no more than 1/1000 of an inch of variance between corresponding signal traces (i.e. a signal trace coupled to processor 101 and the corresponding signal trace coupled to processor 102).

Host computer system 201 includes a central processing unit (CPU) 210, memory 208, display 204, one or more input devices 214 (e.g., mouse, keyboard, storage drives, etc.), one or more peripherals/output devices 216 (e.g., printers, etc.) and a display 204. Control of test system 10 is provided by host computer 10, which may initiate, monitor, and halt test operations. If one (or both) of memory bus comparator 115 and bus compare unit 116 provide an indication of a mismatch, host computer 10 may halt both processors, thereby halting test operations. Alternatively, host computer, upon receiving a mismatch, may allow both processors to continue operation after an indication of a mismatch has been received, in order to enable a user to determine how the processors diverge in operations subsequent to the mismatch. In either case, both memory bus comparator 115 and bus compare unit 116 may convey the received and compared signals to host computer 201 to enable further post-test analysis. Memory bus comparator 115 may convey an indication of a mismatch, as well as any stored data or other information related to the mismatch, to interface control unit 105 via bus link 134. Similarly, bus compare unit 116 may convey an indication of a mismatch and/or other data to interface control unit 105 via bus link 133.

As previously noted, comparator board 100 is coupled to system board 150. In the embodiment shown, comparator board includes a connector 172 attached thereto. Attached to connector 172 is a ribbon cable, which is, in turn, coupled to an interposer board 180. System board 150 includes a CPU socket 186, to which interposer board 180 is configured to be coupled. Accordingly, comparator board 100 is coupled to system board 150 as shown, and in effect, serves as a CPU for system board 150.

Figure 3:
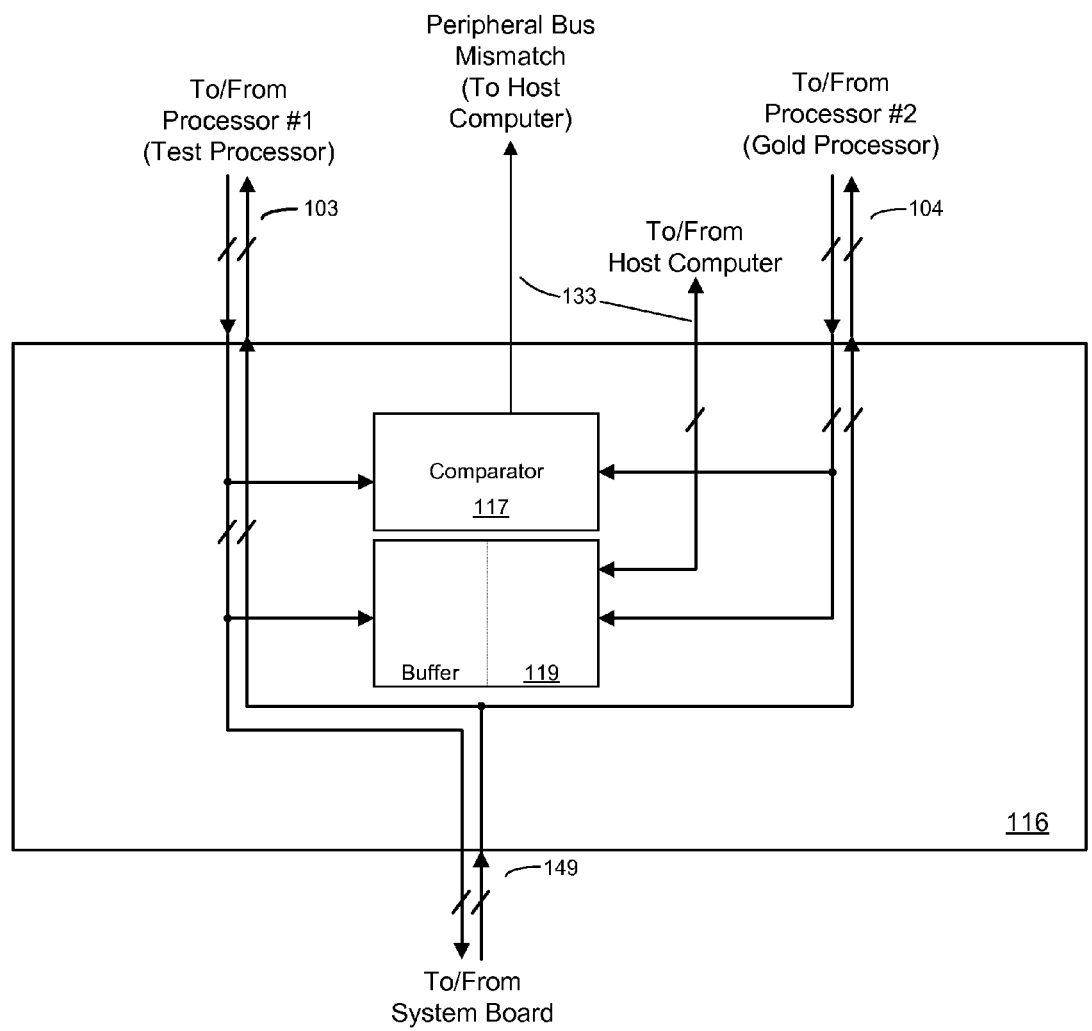
FIG. 3 is a block diagram of one embodiment of a bus compare unit.

Turning now to FIG. 3, a block diagram of one embodiment of a bus compare unit is shown. In the embodiment shown, bus compare unit 116 is coupled to bus link 103 (for communications with the test processor) and bus link 104 (for communications with the gold processor). Bus compare unit 116 also couples the downstream portion of bus link 103 to that of bus link 104. The upstream portion of bus link 149 is further coupled to both the upstream portions of bus links 103 and 104. Thus, bus compare unit 116 may be configured to route downstream bus traffic from the test processor to the system board, while routing upstream bus traffic from the system board to both the test processor and the gold processor.

Bus compare unit 116 includes a comparator 117 that is coupled to receive downstream bus traffic from both the test processor and the gold processor, which are intended to operate in synchronous functional lockstep during testing, assuming the test processor is operating correctly. Comparator 117 is configured to compare the downstream bus traffic generated by the test processor to that generated by the gold processor. If a comparison performed by comparator 117 results in a mismatch, a mismatch signal is asserted and conveyed to the host computer via bus link 133. It should be noted that, in accordance with the test system as shown in FIG. 2, conveying the mismatch signal to the host computer may occur through an interface control unit.

The assertion of a mismatch signal may indicate that the processors are not operating in synchronous functional lockstep, and additionally, may indicate that the test processor is faulty. As noted above, the host computer may halt test operations responsive to receiving an indication of a mismatch, or alternatively, may allow operations to continue to observe the divergence between the gold and test processors. It should be noted that comparisons may be performed for different portions of packets sent by gold and test processors. For example, comparisons of commands, data, and/or CRC information within packets may be performed, with separate mismatch signals corresponding to each. Raw comparisons of binary information sent by the gold and test processors may also be performed. Operation in a skewed timing mode is also possible, wherein a delay may be introduced for one of the processors, with comparisons occurring after the delay has elapsed.

Bus compare unit 116 also includes a buffer 119, which is coupled to receive downstream bus traffic from the test processor (via bus link 103) and the gold processor (via bus link 104). Buffer 119 can store these downstream transactions, which can be later transferred to the host computer via bus link 133. The size of the buffer can vary according to the specific implementation and the requirements thereof. Storing downstream bus traffic from the test and gold processors in buffer 119 may be particularly useful in determining why and how the operation of the test and gold processors diverged if a mismatch occurred. The signal states of bus traffic from each of the test and gold processors may be stored for a number of states. Thus, in addition to capturing the processor states at the time of the mismatch, a number of states prior to the mismatch may also be captured.

Figure 4:
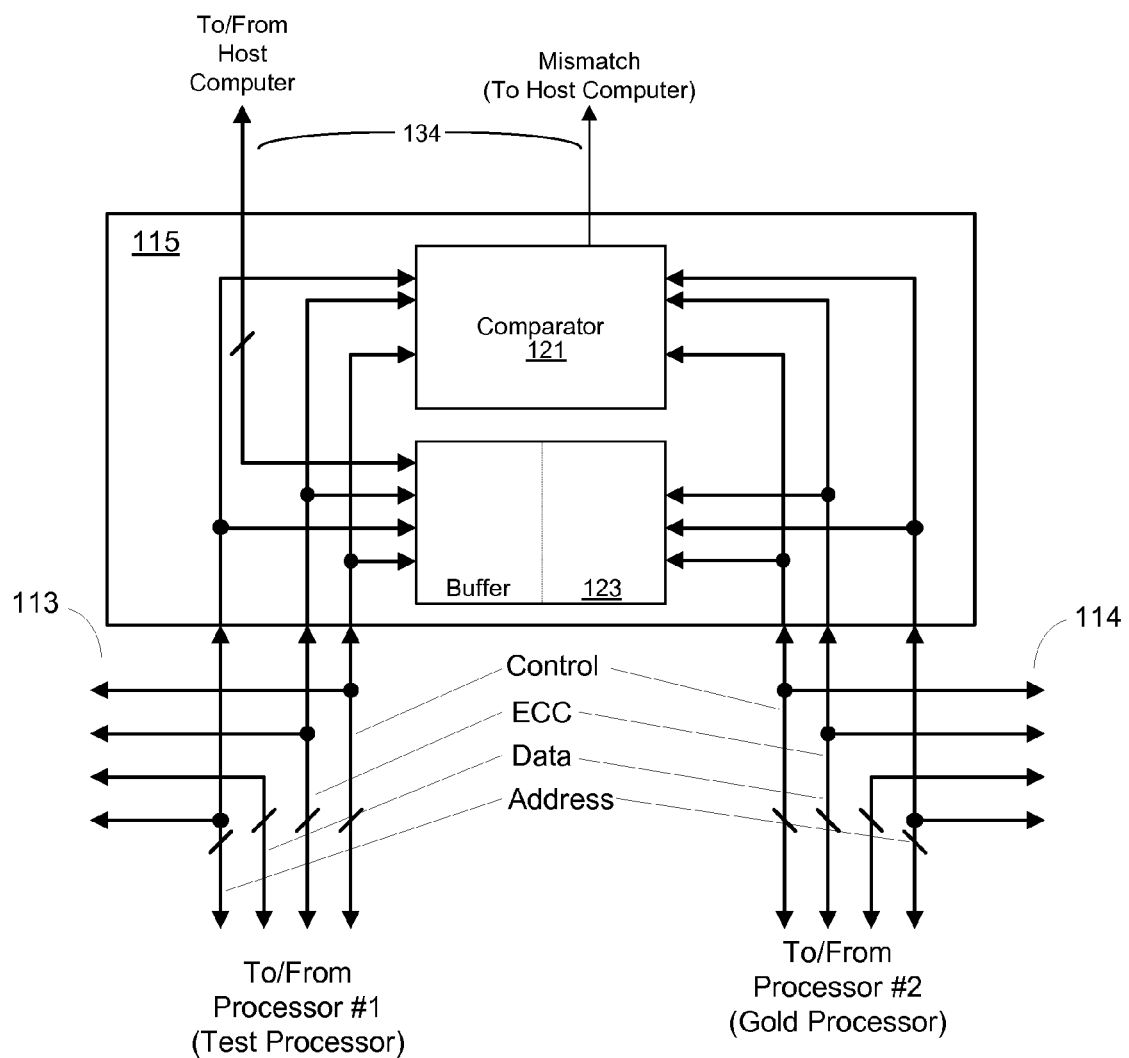
FIG. 4 is a block diagram of one embodiment of a memory bus comparator.

FIG. 4 is a block diagram of one embodiment of a memory bus comparator. In the embodiment shown, memory bus comparator 115 is coupled to receive memory bus signals from the test processor via memory bus 113, and from the gold processor via memory bus 114. However, in this embodiment, memory bus comparator 115 only receives some of the signals transmitted on memory buses 113 and 114. Each of memory buses 113 and 114 is configured to transmit address signals, data signals, ECC (error correcting codes) signals, and control signals (e.g., read enable, write enable, etc.). Memory bus comparator 115 is coupled to receive only the address, control and the ECC signals generated by the test and gold processors. The monitoring of these signals may be sufficient to ensure that both the test and gold processors are generating the same responses on their respectively coupled memory buses. In some embodiments, comparisons may be selectively enabled/disabled for each of address signals, the ECC signals, and/or the address signals, with corresponding mismatch signals being provided for each.

The ECC and control signals from each of memory buses 113 and 114 are conveyed to comparator 121, which is configured to compare the two signal sets. Comparator 121 is configured to assert a mismatch signal responsive to detection of a mismatch between the ECC and control signals received from the two memory buses. The mismatch signal may be conveyed to the host computer via the appropriate signals lines of bus link 134. As noted in the embodiment of FIG. 2, bus link 134 may be coupled to an interface control unit that receives and in turn conveys the mismatch signal to its final destination in the host computer.

In this embodiment, memory bus comparator 115 includes a buffer 123 that is coupled to receive ECC and control signals from memory buses 113 and 114. Buffer 123 is configured to store the signal states, which may be conveyed to the host computer on request. The size of the buffer can vary according to the specific implementation and the requirements thereof. Storing signal states corresponding to ECC and control signals transmitted onto the memory buses 113 and 114 from the test and gold processors may be particularly useful in determining why and how the operation of the test and gold processors diverged if a mismatch occurred.

Figure 5:
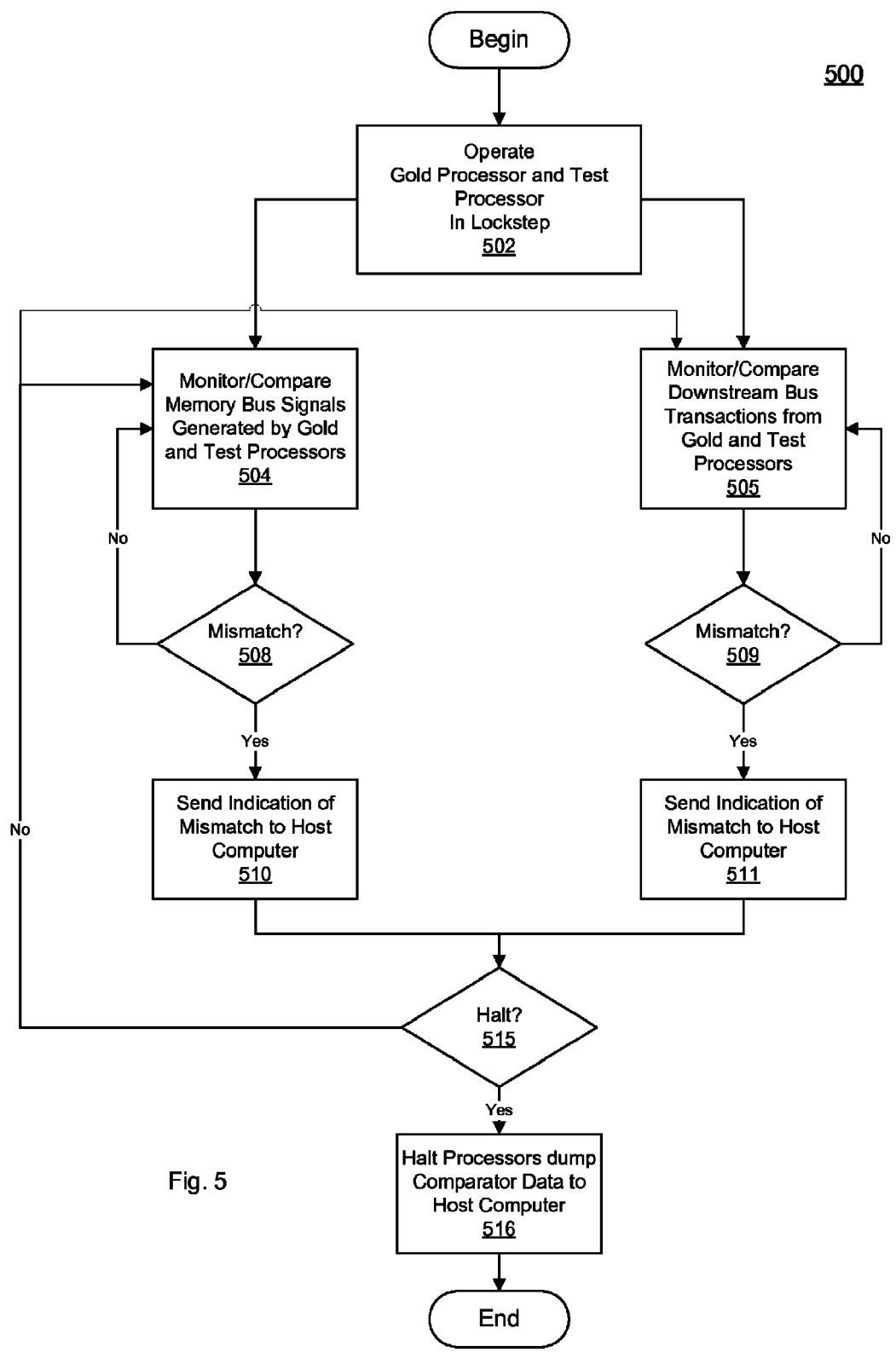
FIG. 5 is a flow diagram illustrating the operation of one embodiment of the processor test system.

Turning now to FIG. 5, a flow diagram illustrating the operation of one embodiment of the processor test system is shown. Method 500 begins with the operation of the test and gold processors operating in synchronous functional lockstep (502). This may occur after a short initialization period in order to allow the processors to become synchronized. As used herein, the term 'synchronous functional lockstep' implies that both processors are operating in the same state concurrently, thereby executing the same instructions, generating the same signal states on the output pins, and so forth, all on the same clock cycle.

During the operation of the test system, monitoring and comparing the states of memory signals generated by the test processor to those generated by the gold processor (504). More particularly, the states of certain signals generated and transmitted by the test and gold processors onto their respective memory buses are compared. As noted above, the comparison may include comparing the states of control and ECC signals generated by the test and gold processors. If no mismatch is detected by the comparisons of the states of the memory signals (508, no), then operation continues. It should be noted that the ECC signals are bi-directional. Thus, the memory bus comparator may include state logic to determine when the ECC signals are being driven from the test/gold processors, and thus usable as a basis for comparison for test and gold processor responses. The state logic may also determine when ECC signals should be discarded (i.e. not compared) when they are either invalid signals or otherwise not driven by the test and gold processors.

Concurrent with the monitoring and comparing of signal states conveyed on the memory buses, the test system also monitors and compares downstream bus transactions conveyed by the test and gold processors (505). If no mismatch is detected between the downstream bus transaction generated by the test processor and those generated by the gold processor (509, no), then test operations continue, and will do so until either the test operations have completed, or at least until a mismatch occurs in the comparisons in one of operations 504 or 505.

A mismatch generated by the memory bus comparisons (508) causes a first mismatch indication to be provided to the host computer (510). A mismatch generated by the bus transaction comparisons causes a second mismatch indication to be sent to the host computer (511). It should be noted that these mismatch indications are independent of one another, and that a memory bus comparison can result in a mismatch in the absence of a bus transaction mismatch, and vice versa.

If either one of the memory bus or bus transaction compare operations results in a mismatch, the host computer makes a decision as to whether to halt test operations. This decision may be dependent upon user input. If a decision is made to halt the test operation (515), both processors are stopped and comparator data is dumped from the buffers of the comparators to the host computer (516). It should be noted that the dumping of data stored in the buffers may be optional, depending on the test system itself and the goals of the particular test operation.

If a decision is made to not halt the processors (515, no), the monitoring and comparing of memory bus signal states and downstream bus transaction continues. Since it is likely that additional mismatches will occur after a first mismatch, the decision as to whether or not to halt the processor may be repeated a number of times, according to input of a test system user or programming of the test system itself. Allowing operations to continue after a mismatch occurs may enable the gathering of memory signal state data and bus transaction data that can be stored in the buffers and subsequently retrieved by the host computer. The stored data can be used, after retrieval, for additional analysis which may give insight as to why the processor operations diverged and may aid in determining the cause of any failures.

The test system and method described herein may be useful in a number of different environments. These environments can include both manufacturing environments (i.e. production test) and development environments.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system for testing a processor, the system comprising:
    a gold processor socket configured to receive a gold processor;
    a test processor socket configured to receive a test processor, wherein the test processor is a device under test (DUT);
    a first memory coupled to the gold processor socket via a first memory bus;
    a second memory coupled to the test processor socket, via a second memory bus, wherein the first and second memories are independent of one another;
    a memory bus comparator coupled to the first memory bus and the second memory bus, wherein the memory bus comparator is configured to, when the gold and test processors are present and operating in their respective sockets, compare memory signals generated by the gold processor to memory signals generated by the test processor and to provide a first indication if a memory bus comparison results in a mismatch;
    a peripheral bus comparator coupled to the gold processor and the test processor socket, wherein the peripheral bus comparator is configured to, when the gold and test processors are present in their respective sockets, compare downstream transactions generated by the gold processor to downstream transactions generated by the test processor and to provide a second indication if a peripheral bus comparison results in a mismatch.

2. The system as recited in claim 1, wherein the system further includes a system board, an interposer coupled to the system board, and a comparator board coupled to the interposer board, wherein the gold and test processor sockets, the first and second memories, the memory bus comparator, and the peripheral bus comparator are mounted on the comparator board.

3. The system as recited in claim 2, wherein the system further includes a host computer system, wherein the host computer system is coupled to receive the first indication and the second indication.

4. The system as recited in claim 2, wherein the system includes a point-to-point (PTP) peripheral bus, wherein a first PTP link of the peripheral bus is coupled between the test processor and the peripheral bus comparator, wherein a second PTP link of the peripheral bus is coupled between the gold processor and the peripheral bus comparator, and wherein a third PTP link of the peripheral bus is coupled between the peripheral bus comparator and an I/O hub on the system board.

5. The system as recited in claim 4, wherein the peripheral bus comparator is configured to convey downstream transactions generated by the test processor to the I/O hub on the system board via the third PTP link.

6. The system as recited in claim 5, wherein the I/O hub is configured to convey upstream transactions to the peripheral bus comparator via the third PTP link.

7. The system as recited in claim 6, wherein the peripheral bus comparator is coupled to receive upstream transactions via the third PTP link and configured to route the upstream transactions to the test processor and the gold processor.

8. The system as recited in claim 6, wherein the peripheral bus comparator includes a buffer coupled to receive and configured to store downstream transactions from the first, and second PTP links, wherein the buffer is externally accessible.

9. The system as recited in claim 2, wherein the system further includes an interface control circuit mounted on the comparator board, wherein the interface control circuit is coupled to receive the first and second indications, and wherein the interface control circuit is coupled to convey the first and second indications to the host computer.

10. The system as recited in claim 1, wherein the memory bus comparator is configured to compare one or more of the following types of memory signals: control signals, ECC (error correcting code) signals, address signals, data signals.

11. The system as recited in claim 1, wherein the test processor and the gold processor each include a memory controller.

12. The system as recited in claim 1, wherein the first and second memories are double data rate (DDR) memories.

13. The system as recited in claim 1, wherein the memory bus comparator and the peripheral bus comparator are field programmable gate arrays (FPGAs).

14. A method for testing a processor, the method comprising:
    operating a gold processor, said operating the gold processor including:
        generating and conveying memory signals to a first memory coupled to the gold processor via a first memory bus;
        generating and conveying downstream transactions to a peripheral bus comparator;
    operating a test processor, said operating the test processor including:
        generating and conveying memory signals to a second memory coupled to the test processor via a second memory bus, wherein the first and second memories are independent of one another;
        generating and conveying downstream transactions to a peripheral bus comparator;
    comparing memory signals conveyed from the gold processor on the first memory bus to memory signals conveyed from the test processor on the second memory bus;
    providing a signal that enables or disables a first indication of a mismatch between the memory signals;
    providing the first indication if said comparing memory signals results in a mismatch when the first indication is enabled by the first signal;
    comparing downstream transactions conveyed from the gold processor on the first peripheral bus to downstream transactions conveyed from the test processor on the second peripheral bus; and
    providing a second indication if said comparing downstream transactions results in a mismatch.

15. The method as recited in claim 14 further comprising:
    conveying downstream transactions from the test processor to a system board;
    the test processor receiving upstream transactions from the system board; and
    the gold processor receiving upstream transactions from the system board.

16. The method as recited in claim 14 further comprising conveying the first indication, when generated, to a host computer, and conveying the second indication, when generated, to the host computer.

17. The method as recited in claim 16, further comprising halting the test processor and the gold processor responsive to the host computer receiving at least one of the first or second indications.

18. The method as recited in claim 16, further comprising storing the downstream transactions generated by the test processor and the downstream transactions generated by the gold processor.

19. The method as recited in claim 18 further comprising providing stored downstream transactions from the test processor and the gold processor to the host computer.

20. The method as recited in claim 14, wherein said generating and conveying memory signals includes generating and conveying control signals, data signals, address signals, and error correcting code (ECC) signals, and wherein said comparing memory signals includes comparing one or more types of said control signals, said data signals, said address signals, and said ECC signals, said memory signals conveyed from the gold processor and from the test processor.

* * * * *